(12) United States Patent
Saitou et al.

(10) Patent No.: US 9,215,806 B2
(45) Date of Patent: Dec. 15, 2015

(54) MONITOR AND WORKING VEHICLE PROVIDED WITH THE MONITOR

(71) Applicants: Tomohiro Saitou, Hiratsuka (JP); Masahiko Hosaka, Hiratsuka (JP)

(72) Inventors: Tomohiro Saitou, Hiratsuka (JP); Masahiko Hosaka, Hiratsuka (JP)

(73) Assignee: Komatsu Ltd., Minato-ku, Tokyo (JP)

( * ) Notice: Subject to any disclaimer, the term of this patent is extended or adjusted under 35 U.S.C. 154(b) by 102 days.

(21) Appl. No.: 13/817,314

(22) PCT Filed: Oct. 18, 2012

(86) PCT No.: PCT/JP2012/076974
§ 371 (c)(1),
(2) Date: Dec. 9, 2013

(87) PCT Pub. No.: WO2014/024328
PCT Pub. Date: Feb. 13, 2014

(65) Prior Publication Data
US 2014/0085838 A1 Mar. 27, 2014

(51) Int. Cl.
*G02F 1/1333* (2006.01)
*H05K 1/14* (2006.01)
*G02F 1/1345* (2006.01)

(52) U.S. Cl.
CPC .............. *H05K 1/14* (2013.01); *G02F 1/13452* (2013.01); *G02F 1/133308* (2013.01); *G02F 2001/133311* (2013.01)

(58) Field of Classification Search
CPC ............ G02F 1/13452; G02F 1/33308; G02F 2001/133311; H05K 1/14
USPC .................................................. 349/149–152
See application file for complete search history.

(56) References Cited

U.S. PATENT DOCUMENTS

| 2006/0152664 A1 | 7/2006 | Nishio et al. |
| 2009/0147487 A1 | 6/2009 | Morimoto |
| 2011/0122334 A1 | 5/2011 | Tang |
| 2011/0187965 A1 | 8/2011 | Ooishi |

(Continued)

FOREIGN PATENT DOCUMENTS

| CN | 1721629 A | 1/2006 |
| CN | 1786784 A | 6/2006 |
| CN | 101251659 A | 8/2008 |

(Continued)

OTHER PUBLICATIONS

International Search Report dated Nov. 27, 2012 from International Application No. PCT/JP2012/076974, 3 pages.

(Continued)

*Primary Examiner* — Ramon Barrera
(74) *Attorney, Agent, or Firm* — Fish & Richardson P.C.

(57) ABSTRACT

A monitor includes a display in a form of a liquid crystal display, a drive substrate that controls the liquid crystal display, a monitor substrate that is provided opposite to the drive substrate with a clearance, a resin-made holder that is disposed in the clearance between the drive substrate and the monitor substrate and holds the liquid crystal display, and a flat cable that electrically connects the drive substrate with the monitor substrate. In the holder, a cable insertion hole into which the flat cable is inserted is provided. In the cable-insertion hole, first and second restrainers that are in parallel to a width direction of the flat cable to be inserted and are separated in a longitudinal direction of the cable are provided.

7 Claims, 8 Drawing Sheets

(56) References Cited

U.S. PATENT DOCUMENTS

| | | |
|---|---|---|
| 2011/0242448 A1 | 10/2011 | Oohira |
| 2015/0036301 A1 | 2/2015 | Ooishi |

FOREIGN PATENT DOCUMENTS

| | | |
|---|---|---|
| CN | 101435929 A | 5/2009 |
| CN | 102141697 A | 8/2011 |
| JP | 01-160876 U1 | 11/1989 |
| JP | 11-231329 A | 8/1999 |
| JP | 2002-049141 A | 2/2002 |
| JP | 2006016915 A | 1/2006 |
| JP | 2006-163100 A | 6/2006 |
| JP | 2009-141241 A | 6/2009 |
| JP | 2010-032955 A | 2/2010 |
| JP | 2011-132800 A | 7/2011 |
| JP | 2010079001 A | 11/2011 |
| KR | 2006071553 A | 6/2006 |

OTHER PUBLICATIONS

Office Action issued Jun. 1, 2015 for corresponding Chinese Application No. 201280002434.4, 17 pages.

MONITOR AND WORKING VEHICLE PROVIDED WITH THE MONITOR

CROSS-REFERENCE TO RELATED APPLICATIONS

This application claims priority to International Application No. PCT/JP2012/076974 filed on Oct. 18, 2012, which application claims priority to Japanese Application No. 2012-179006, filed on Aug. 10, 2012. The contents of the above applications are incorporated herein by reference in their entireties.

TECHNICAL FIELD

The present invention relates to a monitor and a working vehicle provided with the monitor, particularly improvement in a structure of the monitor for holding a flat cable therein.

BACKGROUND ART

As a monitor mounted in a cab of a hydraulic excavator and the like, a monitor including a liquid crystal display has been typically known (see, FIG. 5 of Patent Literature 1).

In such a monitor, circuit substrates such as a power supply substrate and a control substrate are disposed on a back of the liquid crystal display. The circuit substrates are electrically connected to each other by a flexible flat cable. During operation of a working vehicle such as a hydraulic excavator, vibration occurring by driving an engine and a hydraulic device installed in the working vehicle or vibration occurring during digging and the like by working equipment attached to the working vehicle is transmitted to the monitor. When a forklift is used as the working vehicle, vibration occurs during cargo handling (i.e., loading/unloading cargo) and during travelling. There are a variety of amplitudes, directions and occurrence frequency of the vibration occurring during digging, cargo handling or travelling. When the vibration is transmitted to the above-described flat cable installed in the monitor, there is a possibility of such a failure as the flat cable may be rubbed against other portions to break a coating. Accordingly, it is necessary to avoid a design of an unnecessarily long flat cable. For this reason, a flat cable as short as possible is used for connecting adjacent terminals (connectors) on the respective circuit substrates.

There has been proposed a wiring structure for preventing vibration and the like of a flat cable whose one end is soldered to a substrate, whereby tension does not act on a soldered part and bending stress is not generated (see, for instance, Patent Literature 2).

In this wiring structure, depending on a width of the flat cable, one slit or two slits are formed near the soldered part of the substrate. The flat cable is put through (one of) the slit(s) and is drawn out of a back surface of the substrate (the soldered part of the substrate defines a front surface). Then, the flat cable is returned to the front surface by passing around an end of the substrate or by passing through the other of the slits. With this wiring structure, since the flat cable is restrained in both width and longitudinal directions by being put through the slit, the vibration of the flat cable is suppressed to avoid acting of pulling force on the soldered part and generation of bending stress, so that solder peeling can be prevented.

CITATION LIST

Patent Literature(s)

Patent Literature 1: JP-A-2011-132800
Patent Literature 2: JP-A-2009-141241

SUMMARY OF THE INVENTION

Problem(s) to be Solved by the Invention

The structure disclosed in Patent Literature 1 may serve well when connectors for connecting the flat cable are provided at ends of the circuit substrates and positioned to face each other. However, depending on a position, a size and the like of each of the circuit substrates, the connectors are misaligned, so that a longer flat cable may be occasionally required. In such a case, the flat cable may vibrate to be brought into contact with one of the circuit substrates or other components, which may possibly damage a coating of the flat cable. With respect to the flat cable used in the monitor installed in the working vehicle and the like, a fixing structure of the flat cable requires a specific consideration. During operation of the working vehicle and the like, it is necessary to fix the flat cable so that the flat cable itself vibrates as little as possible even when vibration occurring by driving the engine and the like installed in the working vehicle or vibration occurring during digging is transmitted to the flat cable. However, such a structure as the flat cable is firmly fixed causes disadvantages on productivity (e.g., difficult to assemble) and on disassembly performance (e.g., difficult to remove) when the flat cable needs to be removed due to its failure.

Moreover, in the wiring structure proposed in Patent Literature 2, the slit(s) through which the flat cable is inserted is provided in the circuit substrate. Since the circuit substrate is typically made of a glass-epoxy composite material, a highly hard edge having a rough surface is formed on a periphery of the slit(s) and a periphery of the end of the substrate. When the edge and the flat cable having a resin-made coating are brought into contact with each other, the coating may also be damaged.

An object of the invention is to provide a monitor exhibiting excellent productivity and disassembly performance and capable of reliably preventing damage and the like to a coating of the flat cable due to contact with a circuit substrate or other components, and a working vehicle provided with the monitor.

Means for Solving the Problem(s)

According to a first aspect of the invention, a monitor includes: a display; a first circuit substrate that controls the display; a second circuit substrate that is disposed with a clearance from the first circuit substrate; a resin-made holder that is disposed in the clearance between the first circuit substrate and the second circuit substrate and that holds the display; and a flat cable that electrically connects the first circuit substrate and the second circuit substrate, in which the holder includes a cable-insertion hole into which the flat cable is inserted, and a first restrainer and a second restrainer are provided in the cable-insertion hole, the first restrainer and the second restrainer being parallel to each other in a width direction of the flat cable to be inserted while being separated from each other in a longitudinal direction of the flat cable.

In a monitor according to a second aspect of the invention, the first and second restrainers are also separated from each other in a thickness direction of the holder.

In a monitor according to a third aspect of the invention, the holder includes an sight hole penetrating the holder from a front of the holder to a back thereof at a position corresponding to a connecting portion between the flat cable and the first circuit substrate.

In a monitor according to a fourth aspect of the invention, the sight hole is provided at each of longitudinal ends of the connecting portion.

According to a fifth aspect of the invention, a monitor installed near an operator's seat of a working vehicle includes: a display provided by a liquid crystal display; a first circuit substrate that controls the display; a second circuit substrate that is disposed with a clearance from the first circuit substrate; a resin-made holder that is disposed in the clearance between the first circuit substrate and the second circuit substrate and that holds the display; and a flat cable that electrically connects the first circuit substrate and the second circuit substrate, in which the holder includes a cable-insertion hole into which the flat cable is inserted, and a first restrainer and a second restrainer are provided in the cable-insertion hole, the first restrainer and the second restrainer being parallel to each other in a width direction of the flat cable to be inserted while being separated from each other in a longitudinal direction of the flat cable, in which the first and second restrainers are also separated from each other in a thickness direction of the holder, the holder comprises an sight hole penetrating the holder from a front of the holder to a back thereof at a position corresponding to a connecting portion between the flat cable and the first circuit substrate, and the sight hole is provided at each of longitudinal ends of the connecting portion.

According to a sixth aspect of the invention, a working vehicle includes the monitor according to the first to fifth aspects of the invention.

Herein, the working vehicle refers to a vehicle conceptually including a construction machine such as a hydraulic excavator and a wheel loader and an industrial vehicle such as a forklift. The same applies to the working vehicle in the fifth aspect of the invention.

According to the first and sixth aspects of the invention, the resin-made holder for holding the liquid crystal display is provided between the first and second circuit substrates. The cable-insertion hole is formed using this holder. Accordingly, since the flat cable is inserted into the cable-insertion hole and held by the first and second restrainers, vibration of the flat cable is favorably inhibited, so that the flat cable can be prevented from contacting with other components to avoid damage and the like to a coating of the flat cable.

Moreover, only by inserting the flat cable through the cable-insertion hole or drawing the flat cable from the cable-insertion hole, the monitor can be easily assembled or disassembled, resulting in favorable productivity and disassembly performance.

Since the vibration of the flat cable is inhibited by the holder, a longer flat cable is usable without any problem. With this arrangement, connecting positions between the flat cable and the first and second circuit substrates may not be necessarily opposed to each other, and the first and second circuit substrates which are different in dimension can be used.

According to the second aspect of the invention, since the first and second restrainers are separated from each other in the thickness direction of the holder, a curvature radius of the flat cable to be wired by passing between the first and second restrainers can be increased, so that a load applied on a conductor provided in the flat cable can be reduced to prevent breaking of the flat cable. Moreover, since the clearance in the thickness direction exists, the flat cable can be easily inserted and drawn out, thereby further improving productivity and disassembly performance.

In an arrangement where attachment of the liquid crystal display is followed by attachment of the holder, the first circuit substrate in the liquid crystal display is hidden by the attachment of the holder, so that a connecting condition between the flat cable and the first circuit substrate cannot be checked. To cope with this, the sight hole is provided in the holder in the third aspect of the invention. With this arrangement, even after the attachment of the holder, the connecting condition between the flat cable and the first circuit substrate can be checked and a poor attachment of the flat cable can be prevented. Specifically, when a tip end of the flat cable is not firmly attached to the first circuit substrate via the connector or the like, the flat cable may be unplugged due to vibration thereof during operation of the working vehicle. However, provision of the sight hole can prevent incomplete attachment in assembly and also secure a quality of the monitor.

When a long connecting portion extends in the width direction of the flat cable, an overall connecting condition can be checked by visually checking the connecting conditions at both the ends of the flat cable. In other words, in the fourth aspect of the invention, since the pair of sight holes are provided corresponding to both the ends of the connecting portion, the overall connecting condition between the flat cable and the first circuit substrate via the long connecting portion can be reliably checked.

According to the fifth aspect of the invention, the advantages of the first to fourth aspects of the invention can be simultaneously obtained.

DESCRIPTION OF EMBODIMENT(S)

An exemplary embodiment of the invention will be described below with reference to attached drawings.

Figure 1:
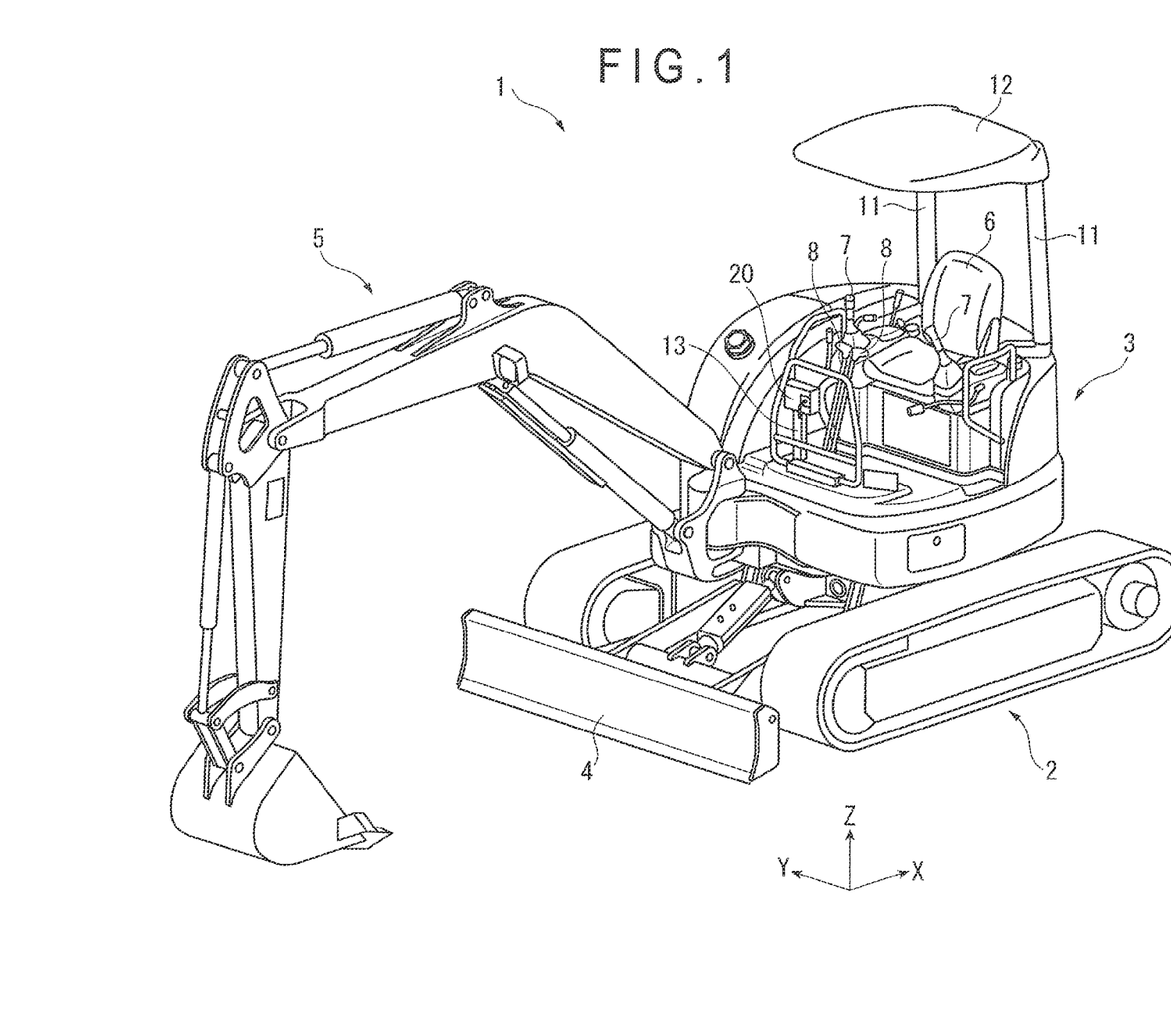
FIG. 1 is a perspective view showing a hydraulic excavator (i.e., a working vehicle) according to an exemplary embodiment of the invention.
Figure 2:
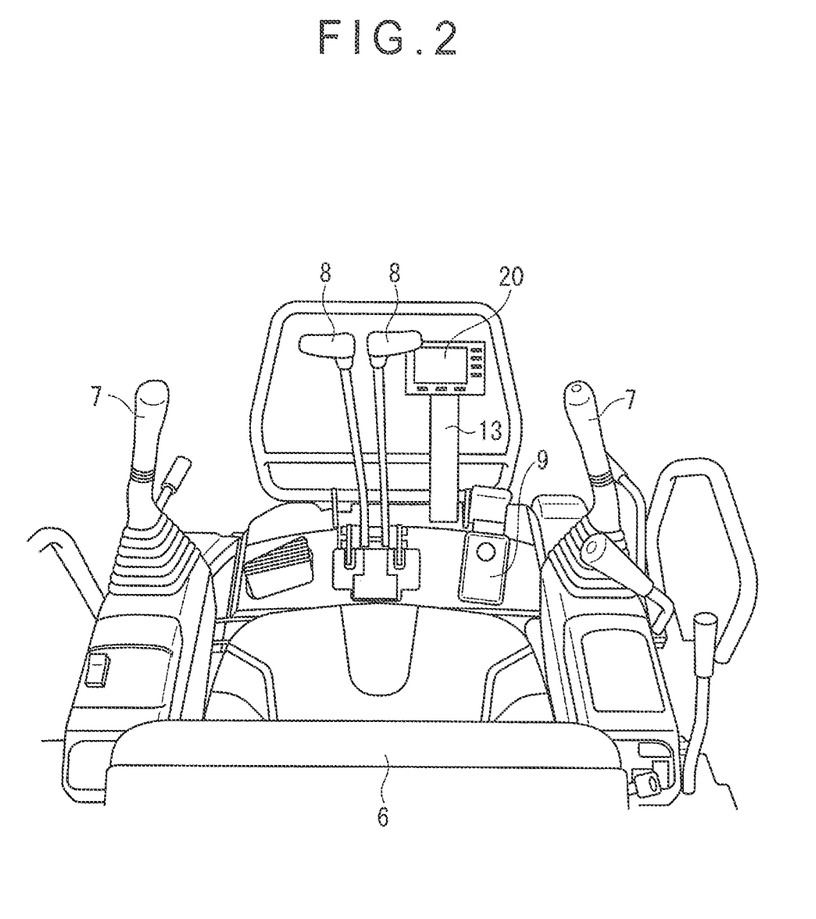
FIG. 2 illustrates the hydraulic excavator as viewed from an operator's seat facing forward.

FIG. 1 is a perspective view of an entirety of a small-sized hydraulic excavator 1 serving as a working vehicle according to the exemplary embodiment. FIG. 2 illustrates the hydraulic excavator 1 as viewed from an operator's seat 6 facing forward.

In FIGS. 1 and 2, the hydraulic excavator 1 is provided with a crawler undercarriage 2, an upper revolving body 3 rotatably mounted on the undercarriage 2, a blade 4 that is provided in front of the undercarriage 2 and is liftable by a hydraulic actuator, and working equipment 5 that is provided in front of the upper revolving body 3. Since the working equipment 5 is well-known one in which a boom, an arm and a bucket are individually driven by a hydraulic actuator, a detailed description of the working equipment 5 will be omitted.

The upper revolving body 3 is provided with working equipment control levers 7, 7 on the right and left of the operator's seat 6, traveling levers 8,8 on a front side of a floor, a control pedal 9 for swinging the boom, and the like (see FIG. 2). The hydraulic excavator 1 in this exemplary embodiment is designed to have a canopy, including a roof 12 supported by two columns 11 standing on the upper revolving body 3 above the operator's seat 6. Further, in the hydraulic excavator 1, a monitor 20 supported by a support frame 13 standing on the floor is provided next to the traveling levers 8. A position of the monitor 20 as shown in FIG. 2 is one example. The monitor 20 may be positioned in a console on the right of the operator's seat 6.

The monitor 20 will be described in details with reference to FIG. 3. The monitor 20 includes a display in a form of a liquid crystal display. Display contents of the liquid crystal display are switchable by operating a plurality of control buttons. Examples of the display contents include a service meter, an engine water temperature gauge, an engine fuel gauge, a preheat monitor, an engine hydraulic monitor, a driving acceleration monitor, an electric system alarm monitor, a fuelometer and a current time. The monitor 20 may be provided by a touch panel in which a plurality of control switches are installed on the liquid crystal display to integrate a display function and an operation function. The display may be provided by an organic electroluminescent display in place of the liquid crystal display.

Figure 3:
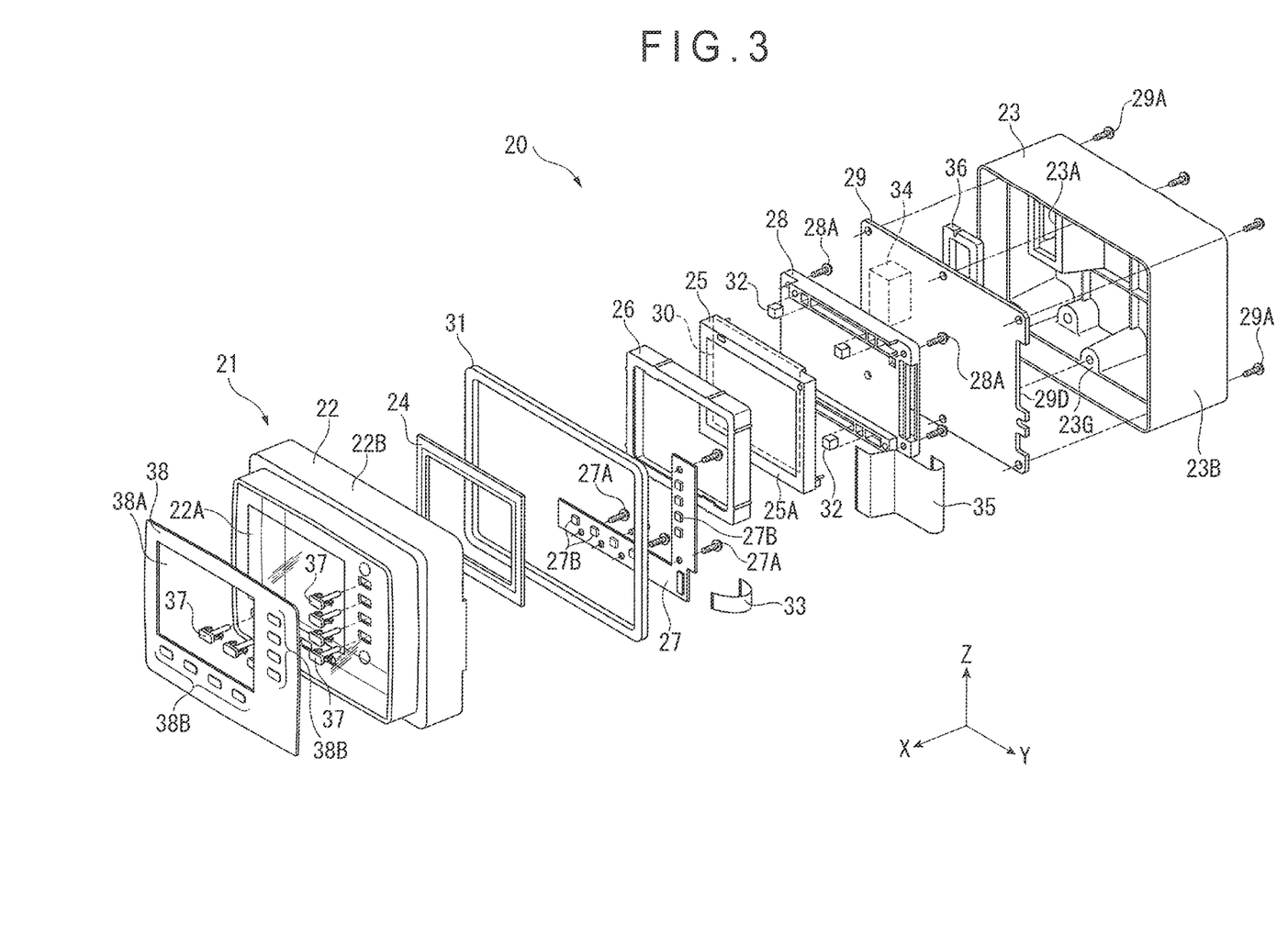
FIG. 3 is an exploded perspective view showing a monitor mounted in the hydraulic excavator.

FIG. 3 is an exploded perspective view showing the monitor 20.

In FIG. 3, the monitor 20 includes an exterior case 21 including a front case 22 and a rear case 23, both of which are shaped in a bottomed box. The front case 22 is formed in a two-color molding with a front face 22A made of a transparent acrylic resin and a side face 22B made of a black AES (acrylonitrile/ethylene-propylene-diene/styrene) resin. The rear case 23 is entirely molded by a black ABS (acrylonitrile-butadiene-styrene) resin. Note that the front case 22 and the rear case 23 may be provided in other colors instead of black. The AES resin is superior to the ABS resin in weather resistance. Accordingly, in the monitor mounted in the working vehicle and exposed outside as in the exemplary embodiment, the AES resin is preferably applied to the front case of the monitor.

A rectangular housing 50 (FIG. 4) is provided at a back of the transparent front face 22A of the front case 22. A liquid crystal display 25 is housed in the housing 50 through a resin frame 24 shaped in a thin plate. At this time, a metallic framing case 25A forming an outer circumference of the liquid crystal display 25 is fitted in an elastic rubber frame 26. The rubber frame 26 absorbs vibration applied on the liquid crystal display 25, thereby securing durability of the liquid crystal display 25. At the same time, the rubber frame 26 absorbs a difference in thermal expansion between the resin-made front case 22 and the metallic framing case 25A, thereby preventing breakage of the front case 22 or the liquid crystal display 25.

In the assembled monitor 20, a display surface 38A of the liquid crystal display 25 (a display surface of a finisher sheet 38) and a control button 38B (a part of the finisher sheet 38 covering a knob switch 37) are substantially coplanar. An L-shaped switch substrate 27 is provided surrounding the liquid crystal display 25 (as shown in FIG. 3, in a positive direction of a Y axis and in a negative direction of a Z axis viewed from the liquid crystal display 25). Moreover, control buttons are provided to form an L shape around the display surface 38A (see FIG. 3). In the exemplary embodiment (FIG. 3), for instance, four control buttons are vertically provided while four control buttons are horizontally provided. However, the number of the control buttons may depend on the function of the monitor 20. A switch 27B (a tact switch) is mounted on the switch substrate 27 in a manner to correspond to the location and the number of the control buttons. When any control button 38B on an operation surface is pressed, the knob switch 37 is displaced in the negative direction of the X axis shown in FIG. 3, whereby a tip end of the knob switch 37 presses a surface of the switch 27B mounted on the switch substrate 27, so that the switch 27B generates an electric signal. The electric signal is transmitted to the monitor substrate 29. For instance, when the control button is operated for causing a screen transition of the liquid crystal display 25 to a predetermined screen, a control signal for the screen transition is transmitted from the monitor substrate 29 to a driving-circuit substrate (not shown) integrally installed with the liquid crystal display 25.

The switch substrate 27 is screwed by screws 27A on a plurality of mounting bosses (not shown) that are integrally formed with the front face 22A and project toward the rear case 23. A plurality of mounting bosses similarly formed (not shown) are provided on the front face 22A. A resin-made holder 28 is screwed by screws 28A on the mounting bosses. Four rubber pressing members 32 are respectively attached at separate positions of the top, the bottom, the right and the left of a front surface of the holder 28 (in the positive direction of the X axis shown in FIG. 3). The holder 28, once attached on the mounting bosses, presses the liquid crystal display 25 from the back thereof (in the negative direction of the X axis shown in FIG. 3) through the pressing member 32, thereby holding the liquid crystal display 25 in order to avoid displacement of the liquid crystal display 25 within the housing 50. Details of the holder 28 will be described later.

Another plurality of mounting bosses (not shown) are formed at four corners of the front face 22A. A monitor substrate 29 (i.e., a second circuit substrate) in which a power supply circuit and a control circuit for the liquid crystal display 25 are formed is placed on the mounting bosses. The holder 28 and the monitor substrate 29 are disposed in a manner to separate from each other with a predetermined interval (at an interval separated in the X direction shown in FIG. 3). The above-described components are housed in the front case 22, into which the rear case 23 is fitted through a gasket 31 formed of urethane for attachment. The rear case 23 is screwed for attachment by screws 29A to the mounting bosses on which the monitor substrate 29 is placed. In other words, the monitor substrate 29 and the rear case 23 are tightened together and attached while being held between the mounting bosses and a screw insertion portion 23G of the rear case 23 (FIG. 3).

Moreover, the switch substrate 27 and the monitor substrate 29 are electrically connected to each other through a flat cable 33. The monitor substrate 29 and a drive substrate 30 (i.e., a first circuit substrate) for a drive circuit which is integrally formed with the liquid crystal display 25 are also connected to each other through a flat cable 35. A substrate for a drive circuit (not shown) receives the control signal from the monitor substrate 29 and controls which color is to be displayed on the liquid crystal display 25.

On the back (in the negative direction of the X axis shown in FIG. 3) of the monitor substrate 29, a connector (a socket) 34, to which an exterior cable for power supply and signal communication is connected, is installed. The connector 34 is exposed outside through an opening 23A provided on the rear case 23. A gasket 36 formed of urethane is attached around the opening 23A in the rear case 23 to seal a clearance generated between the opening 23A and the connector 34. As described above, the monitor 20 has an airproof structure to avoid water and dust from entering an inside of the monitor 20 from the outside.

On the other hand, from a front side of the front case 22, a plurality of knob switches 37 are inserted into the front face 22A of the front case 22. At the tip end of the knob switch 37, the switch 27B installed in the switch substrate 27 is positioned. Pressing the knob switch 37 through the finisher sheet 38 thereon as described above enables the switch 27B to be operated and the display contents of the liquid crystal display 25 to be switched. When the touch panel is used as described above, since the functions of the knob switch 37 and the switch 27B are installed on the touch panel, the knob switch 37 becomes unnecessary. However, the monitor 20 may be provided by a combination of the touch panel, the knob switch 37 and the switch 27B by providing no function to the touch panel while uniquely providing a specific function to the knob switch 37.

The resin-made finisher sheet 38 is attached on the front face 22A in a manner to cover even the knob switch 37.

The monitor substrate 29 receives detection signals from various sensors provided in the working vehicle to transmit to the drive substrate 30 a control signal for displaying on the liquid crystal display 25 various information (e.g., residual fuel information indicated on an engine fuel gauge in response to a detection signal from a fuel amount detection sensor) depending on the detection signals, and stores set values for various operations of the working vehicle, which are set by operation signals generated by operating a control button 38B (knob switch 37). In short, the monitor substrate 29 is uniquely designed for the working vehicle. On the other hand, the drive substrate 30 receives the control signal from the monitor substrate 29 and controls a display on the liquid crystal display 25. The drive substrate 30 is inherent to the liquid crystal display 25.

In a case where the monitor substrate 29 and the drive substrate 30 are provided by a single body, a flat cable 35 is considered unnecessary. In such a case, however, the entire substrate is designed to be peculiar to the working vehicle. The liquid crystal display 25 and the drive substrate 30 function as a so-called information display device and are versatilely applicable to other usage in addition to the monitor 20 of the working vehicle. Accordingly, using the versatile liquid crystal display 25 (and the drive substrate 30) can keep the production cost of the monitor 20 low. From the above, the monitor 20 is structured such that the monitor substrate 29 and the drive substrate 30 are electrically connected to each other through the flat cable 35.

As shown in FIG. 3, among the above-described components, the components from the resin frame 24 to the monitor substrate 29 are contained in the front case 22 while only the connector 34 installed on the monitor substrate 29 protrudes beyond the front case 22 in the negative direction of the X axis (toward the rear case 23) shown in FIG. 3. Accordingly, in the assembled monitor 20, the rear case 23 has an inner space of a large capacity therein. In the inner space, only the connector 34 is located and most of the inner space is kept unoccupied. In other words, the large inner space of the rear case 23 is created by intentionally enlarging a surface area of the surface portion 23B of the rear case 23. By enlarging the surface area of the surface portion 23B, heat generated from the monitor substrate 29 and the liquid crystal display 25 is efficiently radiated outward through the surface portion 23B. Due to the large inner space of the rear case 23, the monitor 20 is enlarged in size in the X direction of FIG. 3. Since an operator's eye direction is the X direction during operations such as digging using a working vehicle, unless the monitor 20 is enlarged in the Y direction or the Z direction of FIG. 3, an operator's view during operations is not disturbed, so that operability is not affected.

Figure 4:
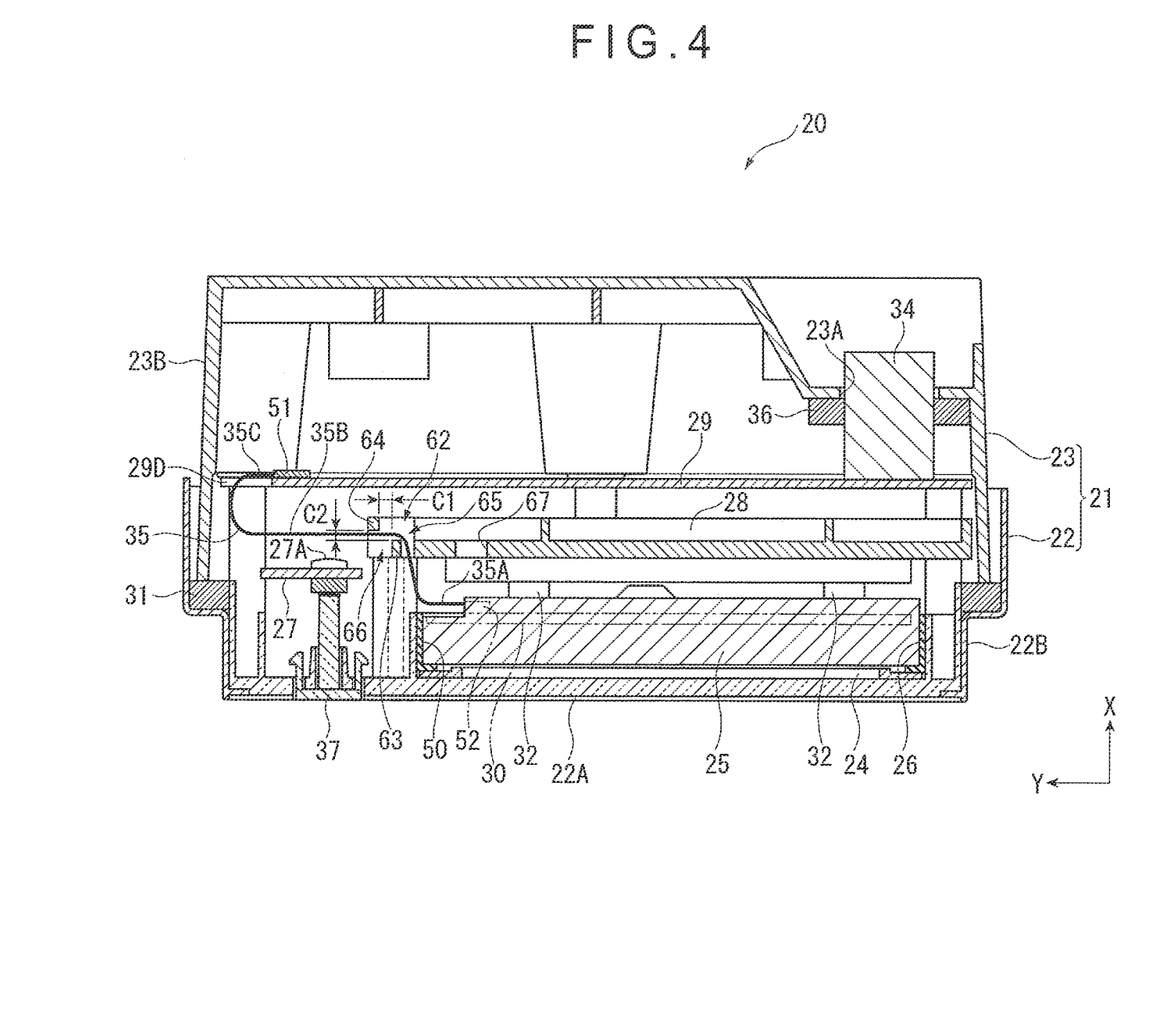
FIG. 4 is a cross-sectional view showing the monitor.

FIG. 4 is a cross-sectional view of the monitor 20 taken along an XY plane shown in FIG. 3 and viewed from a negative direction of the Z axis toward a positive direction thereof in FIG. 3. In FIG. 4, the monitor substrate 29 and the drive substrate 30 of the liquid crystal display 25 are connected to each other by the flat cable 35 having a resin-made coating. One end of the flat cable 35 is connected to the monitor substrate 29 via a connector 51 while the other end of the flat cable 35 is connected to the drive substrate 30 via a connector 52. The connectors 51 and 52 each have a width corresponding to a width of the flat cable 35 and are respectively fixed to the substrates 29 and 30. Ends (terminals) of the flat cable 35, at which the conductor is exposed, are respectively inserted in the connectors 51 and 52 for electrical connection.

Herein, the monitor substrate 29 and the drive substrate 30 are spaced apart from each other in the X direction of FIG. 4, in other words, in a front-back direction of the monitor 20. A switch substrate 27 is interposed between the monitor substrate 29 and the drive substrate 30. Since the monitor substrate 29 and the drive substrate 30 are different in dimension, a connecting position of the flat cable 35 to the monitor substrate 29 and a connecting position of the flat cable 35 to the drive substrate 30 are separated in the Y direction of FIG. 4, in other words, a right-left direction of the monitor 20, as recognized from a positional relation between the connectors 51 and 52.

As described above, the drive substrate 30 receives the control signal from the monitor substrate 29 and controls the display of the liquid crystal display 25. In such an arrangement as a function (electronic circuit) of the drive circuit surrounds a screen of the liquid crystal display 25, a dimension of a front surface (a YZ plane shown in FIG. 3) of the liquid crystal display 25 becomes large. Accordingly, in order to keep the dimension of the front surface of the liquid crystal display 25 from becoming large, the drive substrate 30 is disposed on a back surface (in the positive direction of the X axis shown in FIG. 4) of the liquid crystal display 25. Accordingly, the connector 52 provided to the drive substrate 30 is positioned inside (in the negative direction of the Y axis shown in FIG. 4) relative to an end of the liquid crystal display 25. A reason to use such a liquid crystal display 25 will be described. A dimension of a front surface (a YZ plane shown in FIG. 3) of the monitor 20 installed in the working vehicle and the like is preferably smaller while being large enough to ensure visibility of the liquid crystal display 25 and operability of the control button 38B. This is because an operator needs to work while watching surrounding conditions. When a large monitor 20 is disposed within a visual field of the operator, the operator must move his/her neck or body in order to visually check an object located on the opposite side of the monitor 20.

The flat cable 35 is wired in a manner to pass through a space formed between the monitor substrate 29 and the switch substrate 27. Accordingly, unless the flat cable 35 is fixed, during operation of the working vehicle, the flat cable 35 interferes with the surroundings such as edges of the monitor substrate 29 and the switch substrate 27, where the flat cable 35 may be rubbed to be damaged. Even when the flat cable 35 does not interfere with the surroundings, vibration of the flat cable 35 may cause the flat cable 35 to be unplugged from the connectors 51, 51 to lead to electrical instability, or may cause the flat cable 35 to be broken to lead to electrical failure For this reason, the flat cable 35 needs to be movable as little as possible even when the flat cable 35 receives vibration transmission from the working vehicle. In the exemplary embodiment, not only the liquid crystal display 25 but also the flat cable 35 are held by the holder 28 interposed between the monitor substrate 29 and the drive substrate 30. The holder 28 will be described in detail below.

Figure 5:
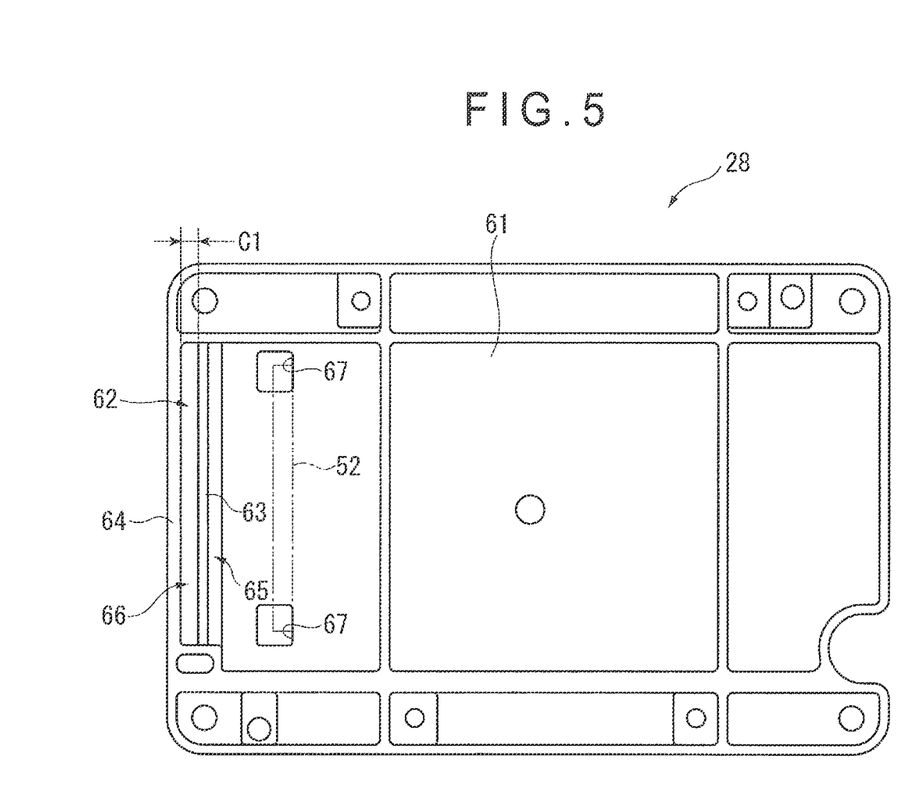
FIG. 5 is a plan view showing a holder used in the monitor.
Figure 6:
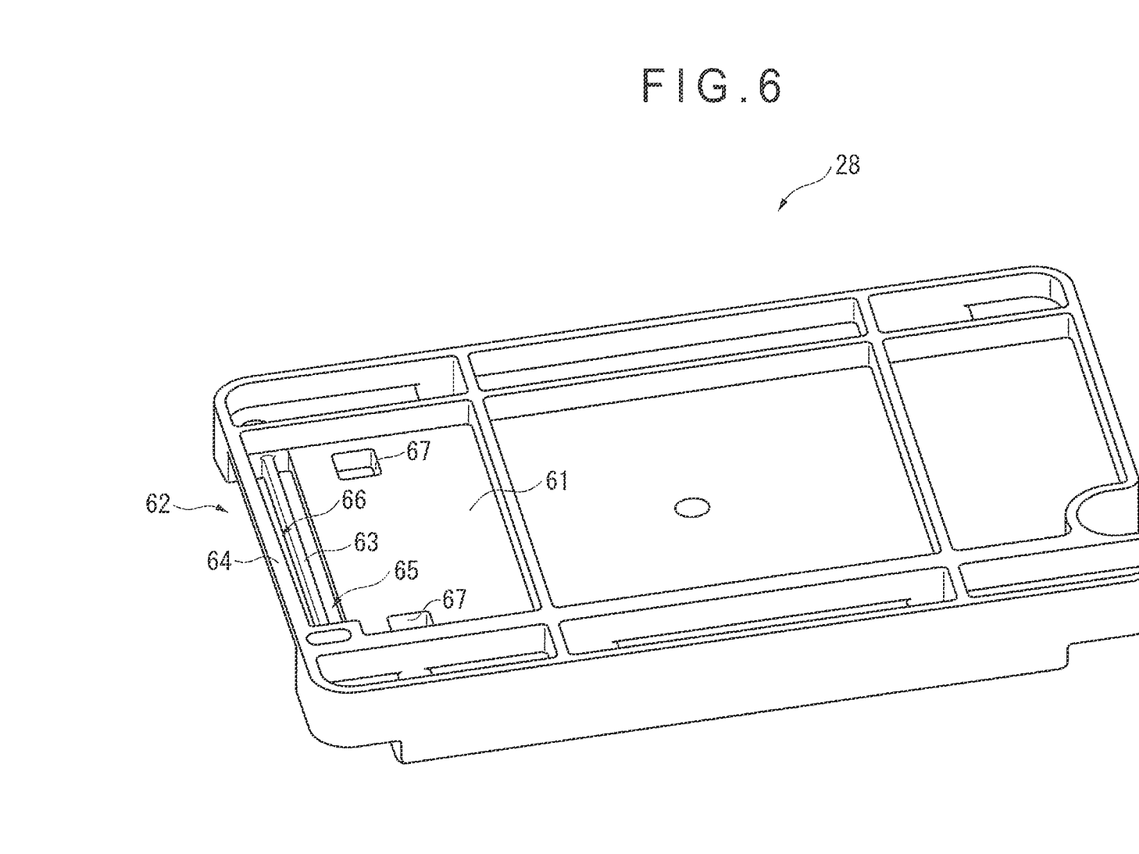
FIG. 6 is a perspective view showing the holder used in the monitor.

FIG. 5 is a plan view showing the holder 28. FIG. 6 is a perspective view showing the holder 28. FIG. 5 shows the holder 28 viewed from the negative direction of the X axis shown in FIG. 3. FIG. 5 shows the holder 28 viewed from the positive direction of the X axis shown in FIG. 4. The holder 28 is a component molded of an ABS (acrylonitrile-butadiene-styrene) resin. As shown in FIG. 4, 5 or 6, the holder 28 is formed in a rectangular shape including a plate-like main body 61 and a plurality of ribs formed on front and back surfaces of the main body 61. The holder 28 may be made of other resin materials in consideration of the cost and moldability. The holder 28 holds the liquid crystal display 25 within the housing 50 of the front case 22. In a working vehicle such as the hydraulic excavator 1 suffering severe vibration during operation, when the liquid crystal display 25 is mechanically fixed (e.g., screwed) to the front case 22 in order to hold the liquid crystal display 25 in the front case 22, the liquid crystal display 25 is likely to directly receive the transmitted vibration to damage the liquid crystal display 25 and the drive substrate 30. Accordingly, the liquid crystal display 25 is held by being entirely pressed toward a front of the housing 50 (in the negative direction of the X axis shown in FIG. 4) via a rubber-made pressing member 32 using the holder 28 having an area equivalent to an area of the front surface of the liquid crystal display 25, so that a sufficient vibration resistance is obtained. The pressing member 32 functions as a cushioning material.

The resin-made holder 28 is fixed with the screws 28A to the mounting bosses (not shown) on the front case 22 made of a material having similar physical properties (AES resin). Specifically, since the thermal expansion ratio of the holder 28 is substantially the same as that of the front case 22, even when both the holder 28 and the front case 22 are thermally expanded during operation of the working vehicle under high temperatures, attachment of the holder 28 to the front case 22 is not so significantly changed to keep the holding state of the liquid crystal display 25 favorable.

A cable-insertion hole 62 extends along a lateral direction of the holder 28 at one of longitudinal ends of the holder 28. The flat cable 35 is held by passing through the cable-insertion hole 62. As shown in FIG. 4, the cable-insertion hole 62 is provided between the liquid crystal display 25 (drive substrate 30) and the monitor substrate 29 in the front-back direction of the monitor 20. More specifically, the cable-insertion hole 62 is positioned between the switch substrate 27 and the monitor substrate 29. Moreover, the cable-insertion hole 62 is positioned substantially at the center of the right-left direction (the Y direction in FIG. 4) relative to the connecting portions of the flat cable 35 to the respective substrates 29 and 30 while being positioned closer to the liquid crystal display 25 (in the negative direction of the Y axis shown in FIG. 4) apart from the switch substrate 27.

A pair of first restrainer 63 and second restrainer 64 are provided in the cable-insertion hole 62, and are parallel to each other in a width direction of the flat cable 35 to be inserted while being separated from each other in a longitudinal direction of the flat cable 35. The cable-insertion hole 62 includes, in addition to the first and second restrainers 63 and 64, a first opening 65 on an inner side and a second opening 66 on an outer side. The first restrainer 63 and the second restrainer 64 are in contact with the flat cable 35 to restrain the flat cable 35. The first restrainer 63 and second restrainer 64 are separated from each other only with a clearance C1 in the right-left direction in FIG. 4 (the Y direction in FIG. 4), in other words, in an in-plane direction of the holder 28. The first restrainer 63 and the second restrainer 64 are quadrangular in cross section. Each corner thereof is chamfered or rounded (curved) so as not to damage the coating of the flat cable 35 (not shown in enlargement).

The first opening 65 and the second opening 66 are respectively spaces penetrating the holder 28 from a front to a back thereof. In other words, the spaces penetrating a plane of FIG. 5 in a vertical direction are formed in the holder 28 as the first opening 65 and the second opening 66.

Further, the first restrainer 63 and the second restrainer 64 are also separated from each other in the front-back direction of the monitor 20 (the X direction shown in FIG. 4), namely, in a thickness direction of the holder 28. Specifically, the first restrainer 63 is positioned near the liquid crystal display 25 while the second restrainer 64 is positioned near the monitor substrate 29. A clearance C2 is provided between the first restrainer 63 and the second restrainer 64. A dimension of the clearance C2 is larger than a thickness of the flat cable 35. Since the clearance C2 and the clearance C1 (see FIG. 4) are provided in a predetermined dimension, the flat cable 35 is restrained and held within the cable-insertion hole 62 without being bent in a smaller curvature radius. Subsequently, the flat cable 35 is drawn out of the cable-insertion hole 62 in a manner to be substantially in parallel to the switch substrate 27 and the monitor substrate 29. The drawn-out flat cable 35 is installed without interfering with the surroundings (the substrates 27 and 29, and the screws 27A), so that, even when the flat cable 35 receives the transmitted vibration, the flat cable 35 does not contact with the surroundings. The flat cable 35 is inserted through a notch 29D of the monitor substrate 29 and is connected to the monitor substrate 29 via the connector 51. Since the holder 28 as described above is used, the flat cable 35 is restrained and held in the Y and X directions shown in FIG. 4 by the first and second restrainers 63 and 64 and the first and second openings 65 and 66 of the holder 28, so that a movement of the flat cable 35 is suppressed.

Figure 7:
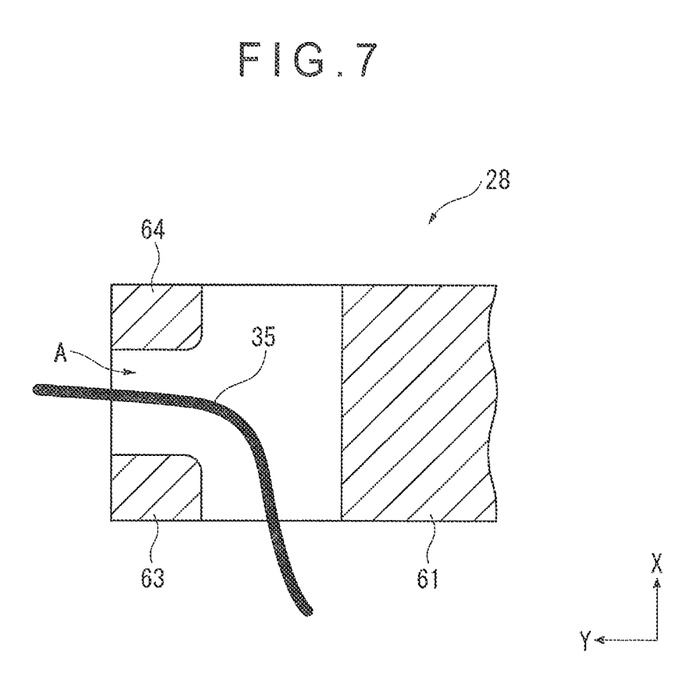
FIG. 7 is a cross-sectional view for explaining necessity of a clearance C1.

The holder 28 is produced by injection molding. A die used for injection molding is separable in the thickness direction of the holder 28 (in the vertical direction relative to the plane of FIG. 5) into an upper die and a lower die. A resin is injected into the die with the upper die and the lower being jointed. Accordingly, provided that the clearance C1 is defined as zero or below, a die structure becomes complicated to increase the production cost of the holder 28. In other words, when the first restrainer 63 and the second restrainer 64 are juxtaposed in the X direction of FIG. 4 as shown in FIG. 7, in order to form a space A between the first restrainer 63 and the second restrainer 64, a die corresponding to a volume of the space A needs to be inserted from a lateral direction (the positive direction of the Y axis shown in FIG. 4) before injection molding. In short, the holder 28 cannot be molded with a simple die with an upper die and a lower die being jointed. Accordingly, the clearance C1 needs to be in a predetermined dimension.

Figure 8:
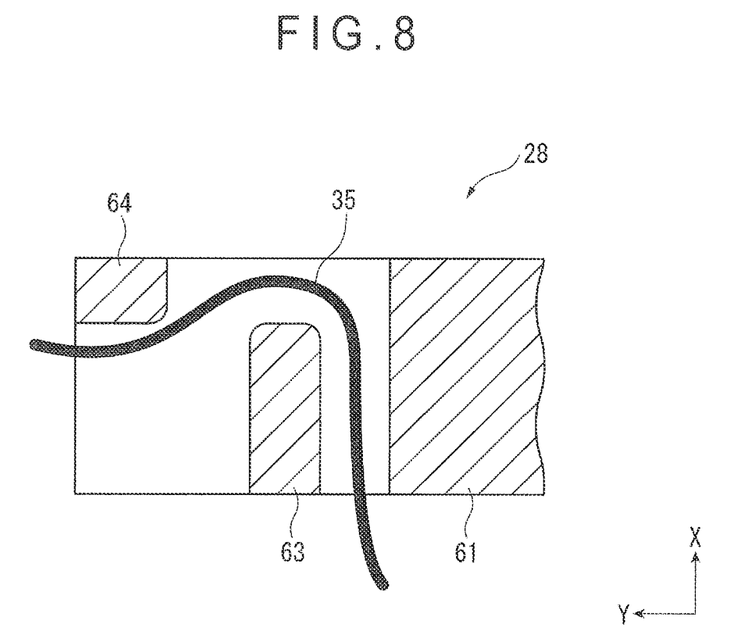
FIG. 8 is a cross-sectional view for explaining necessity of a clearance C2.

On the other hand, provided that the clearance C2 is zero or below, more parts of the flat cable 35 needs to be bent as shown in FIG. 8. Accordingly, provided that the clearance C2 is zero or below, although the flat cable 35 can be held, it becomes difficult to insert the flat cable 35 through the cable-insertion hole 62 to deteriorate assembly performance. This is because it is necessary to insert the flat cable 35 into the cable-insertion hole 62 from the positive direction of the Y axis toward the negative direction thereof in FIG. 8 and then to pass the flat cable 35 to the first restrainer 63 while lifting the cable 35 in the positive direction of the X axis. With the holder 28 according to the exemplary embodiment, it is easy to draw the flat cable 35 through the cable-insertion hole 62. For the above reason, the clearance C2 also needs to have a predetermined dimension.

A pair of sight holes 67, 67 penetrating the holder 28 from the front to the back are provided on the main body 61 of the holder 28 and at a position corresponding to the connector 52 provided on the drive substrate 30 of the liquid crystal display 25. The sight holes 67 are provided inwardly (in the negative direction of the Y axis shown in FIG. 4) relative to the cable-insertion hole 62 and at positions where both longitudinal ends of the connector 52 can be viewed through the sight holes 67. In assembly of the monitor 20, since the holder 28 is attached to a back of the liquid crystal display 25, the connecting portion between the flat cable 35 and the drive substrate 30 (a portion where the flat cable 35 is inserted into the connector 52) becomes invisible. However, provision of the pair of sight holes 67, 67 penetrating the holder 28 (penetrating the plane of FIG. 5 in the vertical direction) enables an assembly operator to visually check a connecting condition between the flat cable 35 and the connector 52 (hereinafter, referred to as a "connecting condition") through the sight holes 67, 67.

Supposing that the flat cable 35 is diagonally inserted into the connector 52, at the connecting portion viewed from the positive direction of the X axis shown in FIG. 4, the flat cable 35 is firmly inserted in one end of the connector 52, where the terminal (uncoated portion) of the flat cable 35 appears to be hidden by the connector 52. However, the flat cable 35 does not appear to be firmly inserted in the other end of the connector 52, where the terminal (uncoated portion) of the flat cable 35 is exposed. Since the sight holes 67, 67 of the holder 28 are positioned such that both the ends of the connector 52, in other words, the connecting condition between the connector 52 and the flat cable 35 can be viewed through the sight holes 67, 67, as long as the connecting condition viewed from the sight holes 67, 67 is visually checked to be a proper condition, the connector 52 and the flat cable 35 are properly connected to each other in the entire longitudinal direction of the connector 52. Consequently, production of a monitor 20 with an improper connecting condition between the connector 52 and the flat cable 35 is avoided. Moreover, by using such a holder 28, the monitor 20 having a proper connecting condition between the connector 52 and the flat cable 35 can be installed in the working vehicle and unplugging of the flat cable 35 from the connectors 51 and 52 due to vibration created by the working vehicle during operation can be inhibited.

After the liquid crystal display 25 connected with the flat cable 35 is housed in the housing 50, the liquid crystal display 25 is assembled into the above-described holder 28 in a manner to be pressed toward a front of the monitor 20 (in the negative direction of the X axis shown in FIG. 4). When the liquid crystal display 25 is assembled into the holder 28, initially, the flat cable 35 that has been wired in parallel to an in-plane direction (the Y direction of FIG. 4) of the drive substrate 30 (i.e., has been inserted in the connector 52) is raised toward the back of the monitor 20 (the positive direction of the X axis shown in FIG. 4) while leaving a first parallel portion 35A in parallel. A free end (a terminal to be inserted into the connector 51) of the flat cable 35 is inserted through the first opening 65 of the cable-insertion hole 62, passes through the clearance between the first and second restrainers 63 and 64, and is drawn out of a lateral side (in the positive direction of the Y axis shown in FIG. 4) of the holder 28 through the second opening 66.

At this stage, an amount of the flat cable 35 to be drawn out of the holder 28 is adjusted by defining a length of the first parallel portion 35A of the flat cable 35. Subsequently, the holder 28 is disposed on mounting bosses (not shown) provided on the front face 22A of the front case 22. At the completion of insertion of the flat cable 35 into the cable-insertion hole 62, it is checked through the two sight holes 67, 67 whether or not the flat cable 35 is unplugged from the connector 52 of the drive substrate 30. After checking, the holder 28 is screwed on the mounting bosses (not shown) with the screws 28A. Subsequently, the flat cable 35 is again raised toward the back of the monitor 20 while leaving a second parallel portion 35B in parallel, and is curved reversely to provide a third parallel portion 35C. The end of the flat cable 35 is inserted into the connector 51. Thus, the drive substrate 30 and the monitor substrate 29 are electrically connected to each other through the flat cable 35. Even at the completion of this connecting operation, the connecting condition of the flat cable 35 and the connector 52 of the drive substrate 30 can be checked through the sight holes 67, 67. After checking, the monitor substrate 29 is disposed on mounting bosses (not shown) and is finally screwed along with the rear case 23 using the screws 29A.

Since the flat cable 35 wired between the switch substrate 27 and the monitor substrate 29 is firmly restrained and held by passing through the cable-insertion hole 62 of the holder 28, the flat cable 35 does not move enough to interfere with the substrates 27 and 29 and other components even when the working vehicle is operated to create vibration. Moreover, the flat cable 35 is in contact with the first and second restrainers 63 and 64 of the cable-insertion hole 62. Since the first and second restrainers 63 and 64 are made of resins and the periphery of each of those is chamfered or rounded (curved), a hard edge observed in a composite material for a circuit substrate (e.g., glass-epoxy composite material) does not exist, so that a coating of the flat cable 35 is not damaged.

Incidentally, the invention is not limited to the above-described exemplary embodiment, but includes modifications and improvements as long as the objects of the invention can be achieved.

Although the exemplary embodiment describes that the monitor of the invention is exemplarily installed in the hydraulic excavator 1, the monitor of the invention may be installed in a working vehicle such as other construction machines (e.g., a wheel loader) and industrial vehicles (e.g., a forklift).

Although the pair of sight holes 67, 67 are formed on the holder 28 in the above exemplary embodiment, a single sight hole may be provided instead of the pair of sight holes 67, 67 as long as a dimension of the sight hole is sufficient to view an entirety of the connector 52. The number, the dimension and the like of the sight hole 67 may be determined as needed in consideration of a shape and a dimension of the connector 52, further a resin flow in the die during resin molding, the die structure and the like.

In the above exemplary embodiment, the first and second restrainers 63 and 64 are spaced apart in the thickness direction of the holder 28 in the cable-insertion hole 62 of the holder 28 and the clearance C2 is formed between the first and second restrainers 63 and 64. However, the invention encompasses a case where such a clearance C2 is not formed (a case where the clearance C2 is zero). However, in such a case, the flat cable 35 is more firmly restrained and held in the longitudinal direction of the flat cable 35 by the first and second restrainers 63 and 64, whereas the flat cable 35 may be curved in a relatively small curvature radius depending on a cross-sectional dimension of the first and second restrainers 63 and 64 to affect (e.g., to break) the conductor in the flat cable 35. Accordingly, it is desirable to provide predetermined clearances C1 and C2 between the first and second restrainers 63 and 64 in order to wire the flat cable 35 in a curvature radius enough not to affect the conductor. Moreover, with a structure of the cable-insertion hole 62 of the holder 28 in which the flat cable 35 is curved in a relatively small curvature radius to be held, it takes time to insert the flat cable 35 into the cable-insertion hole 62 of the holder 28 in assembly of the monitor 20, so that the flat cable 35 may be damaged during operation. Accordingly, it is desirable to form the predetermined clearances C1 and C2 also in terms of assembly performance.

The invention claimed is:

1. A monitor comprising:
a display;
a first circuit substrate that controls the display;
a second circuit substrate that is disposed with a clearance from the first circuit substrate;
a resin-made holder that is disposed in the clearance between the first circuit substrate and the second circuit substrate and that holds the display; and
a flat cable that electrically connects the first circuit substrate and the second circuit substrate, wherein
the holder comprises a cable-insertion hole into which the flat cable is inserted, and
a first restrainer and a second restrainer are provided in the cable-insertion hole, the first restrainer and the second restrainer being parallel to each other in a width direction of the flat cable to be inserted while being separated from each other in a longitudinal direction of the flat cable.

2. The monitor according to claim 1, wherein
the first restrainer and the second restrainer are also separated from each other in a thickness direction of the holder.

3. The monitor according to claim 1, wherein
the holder comprises an sight hole penetrating the holder from a front of the holder to a back thereof at a position corresponding to a connecting portion between the flat cable and the first circuit substrate.

4. The monitor according to claim 3, wherein
the sight hole is provided at each of longitudinal ends of the connecting portion.

5. A monitor installed near an operator's seat of a working vehicle, the monitor comprising:
a display provided by a liquid crystal display;
a first circuit substrate that controls the display;
a second circuit substrate that is disposed with a clearance from the first circuit substrate;
a resin-made holder that is disposed in the clearance between the first circuit substrate and the second circuit substrate and that holds the display; and
a flat cable that electrically connects the first circuit substrate and the second circuit substrate, wherein
the holder comprises a cable-insertion hole into which the flat cable is inserted, and
a first restrainer and a second restrainer are provided in the cable-insertion hole, the first restrainer and the second restrainer being parallel to each other in a width direction of the flat cable to be inserted while being separated from each other in a longitudinal direction of the flat cable, wherein
the first restrainer and the second restrainer are also separated from each other in a thickness direction of the holder,
the holder comprises an sight hole penetrating the holder from a front of the holder to a back thereof at a position corresponding to a connecting portion between the flat cable and the first circuit substrate, and
the sight hole is provided at each of longitudinal ends of the connecting portion.

6. A working vehicle comprising the monitor according to claim 1.

7. A working vehicle comprising the monitor according to claim 5.

* * * * *